US012749659B2

(12) United States Patent
Bang

(10) Patent No.: US 12,749,659 B2
(45) Date of Patent: Sep. 29, 2026

(54) FOCUS RING UNIT AND SUBSTRATE PROCESSING APPARATUS

(71) Applicant: SEMES CO., LTD., Chungcheongnam-do (KR)

(72) Inventor: Su Ryong Bang, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 773 days.

(21) Appl. No.: 18/105,274

(22) Filed: Feb. 3, 2023

(65) Prior Publication Data

US 2023/0317426 A1 Oct. 5, 2023

(30) Foreign Application Priority Data

Apr. 1, 2022 (KR) ........................ 10-2022-0041360

(51) Int. Cl.
*H01J 37/32* (2006.01)

(52) U.S. Cl.
CPC .. *H01J 37/32642* (2013.01); *H01J 37/32715* (2013.01)

(58) Field of Classification Search
CPC ............ C23C 16/4585; H01J 37/32642; H01J 37/32715; H01L 21/68735; H10P 72/7611
See application file for complete search history.

(56) References Cited

U.S. PATENT DOCUMENTS

| | | | | |
|---|---|---|---|---|
| 2004/0040940 | A1* | 3/2004 | Fink | H01J 37/32642 219/121.43 |
| 2005/0061447 | A1* | 3/2005 | Kim | H01L 21/6831 156/345.51 |
| 2005/0224180 | A1* | 10/2005 | Bera | H01J 37/3244 156/345.33 |
| 2008/0245479 | A1* | 10/2008 | Huang | H01J 37/32642 156/345.33 |
| 2010/0041240 | A1* | 2/2010 | Tsujimoto | H01J 37/32642 156/345.43 |
| 2019/0164727 | A1 | 5/2019 | Sugawa et al. | |
| 2019/0203353 | A1* | 7/2019 | Jeon | H01J 37/32715 |
| 2020/0194237 | A1* | 6/2020 | Ikari | H01J 37/32541 |
| 2025/0149306 | A1* | 5/2025 | Mankidy | H01L 21/67213 |

FOREIGN PATENT DOCUMENTS

| | | | |
|---|---|---|---|
| JP | 6932070 | B2 | 9/2021 |
| KR | 10-2019-0083473 | A | 7/2019 |
| KR | 10-2102131 | B1 | 4/2020 |

OTHER PUBLICATIONS

Korean Office Action issued in corresponding KR Patent Application No. 10-2022-0041360, dated Sep. 20, 2023.

* cited by examiner

*Primary Examiner* — Benjamin Kendall
(74) *Attorney, Agent, or Firm* — Carter, DeLuca & Farrell LLP

(57) ABSTRACT

A focus ring capable of evaluating a plurality of focus ring shapes is provided. A focus ring unit, as a focus ring used in a substrate processing device includes a plurality of parts with different conditions of an exposed surface facing a plasma space in a circumferential direction.

20 Claims, 13 Drawing Sheets

( a )

( b )

FOCUS RING UNIT AND SUBSTRATE PROCESSING APPARATUS

CROSS-REFERENCE TO RELATED APPLICATION(S)

This application claims benefit of priority to Korean Patent Application No. 10-2022-0041360 filed on Apr. 1, 2022 in the Korean Intellectual Property Office, the disclosure of which is incorporated herein by reference in its entirety.

BACKGROUND

1. Field

The present disclosure relates to a focus ring unit and a substrate processing apparatus including the same.

2. Description of Related Art

In general, the process of manufacturing a semiconductor device includes a deposition process for forming a film on a semiconductor wafer (hereinafter, referred to as a substrate), a chemical/mechanical polishing process for planarizing the film, a photolithography process for forming a photoresist pattern on the film, an etching process for forming a film into a pattern having electrical characteristics using a photoresist pattern, an ion implantation process for implanting specific ions into a predetermined region of the substrate, a cleaning process for removing impurities from the substrate, an inspection process for inspecting the surface of the substrate on which the film or pattern is formed, and the like.

The etching process is a process for removing an exposed area of a photoresist pattern formed on a substrate by a photolithography process. In general, the type of etching process may be divided into dry etching and wet etching.

In the dry etching process, an electrical field is formed by applying high-frequency power to an upper electrode and a lower electrode installed at a predetermined interval in a sealed internal chamber in which an etching process is performed, and after applying the electrical field to the reaction gas supplied to the internal chamber to activate the reaction gas and turn the reaction gas into a plasma state, the ions in the plasma etch the substrate disposed on the lower electrode.

In this case, it is necessary to uniformly form the plasma on the entire upper surface of the substrate. A focus ring is provided to uniformly form plasma on the entire upper surface of the substrate.

The focus ring is installed to surround the edge of the electrostatic chuck disposed on the lower electrode.

An electrical field is formed on the upper portion of the electrostatic chuck by applying high-frequency power, and the focus ring greatly expands the area where the electrical field is formed, compared to the area where the substrate is located. Depending on the shape of the focus ring, the plasma-sheath boundary near the periphery of the substrate changes.

When designing such a focus ring, hardware evaluation of manufacturing a real focus ring, installing the focus ring in a substrate processing device, and then performing plasma processing on the substrate is performed. If the shape of the focus ring changes, a new focus ring should be manufactured, and there is a problem in that a lot of cost and time are consumed because the inspection should be performed for each shape.

SUMMARY

An aspect of the present disclosure is to provide a focus ring capable of evaluating a plurality of focus ring shapes.

An aspect of the present disclosure is to provide the following focus ring unit to obtain the above object.

According to an aspect of the present disclosure, a focus ring unit, as a focus ring used in a substrate processing device, includes a plurality of parts with different conditions of an exposed surface facing a plasma space in a circumferential direction.

The plurality of parts may include an inclined surface having an inclination angle with respect to a radial direction of the ring, and a first surface connected to an outer end of the inclined surface in the radial direction and parallel to the radial direction, and the exposed surface may include the inclined surface and the first surface.

The plurality of parts may include a second surface connected to an inner end of the inclined surface in the radial direction and parallel to the radial direction.

The plurality of parts may include a protrusion protruding inward in a radial direction and an upper surface parallel to the radial direction at a position spaced apart in a height direction from the protrusion, and a condition of the exposed surface may include at least one of a distance from a center of the ring to the protrusion and a height from the protrusion to the upper surface.

Exposed surfaces of the plurality of parts may be divided by a boundary surface, and the focus ring unit may be formed by assembling the plurality of parts.

According to an aspect of the present disclosure, a focus ring unit used in a substrate processing apparatus includes a plurality of parts including an inclined surface having an inclined angle with respect to a radial direction of the focus ring unit, a first surface connected to an outer end of the inclined surface in a radial direction and parallel to the radial direction, and a second surface connected to an inner end of the inclined surface in the radial direction and parallel to the radial direction. The parts are configured to have a first angle from a center of a ring and connected to form the focus ring unit, the part is different from a neighboring part in a condition of an exposed surface facing a plasma space, and the condition of the exposed surface includes at least one of an inclination angle of the inclined surface, a height by the inclined surface, and a length of the second surface in a radial direction.

According to an aspect of the present disclosure, a substrate processing device includes a chamber providing a processing space therein; an electrostatic chuck disposed within the chamber and supporting a substrate; a focus ring unit disposed to surround an outer circumference of the electrostatic chuck; and a plasma generating unit generating plasma in the chamber. The focus ring unit is the focus ring unit described above.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
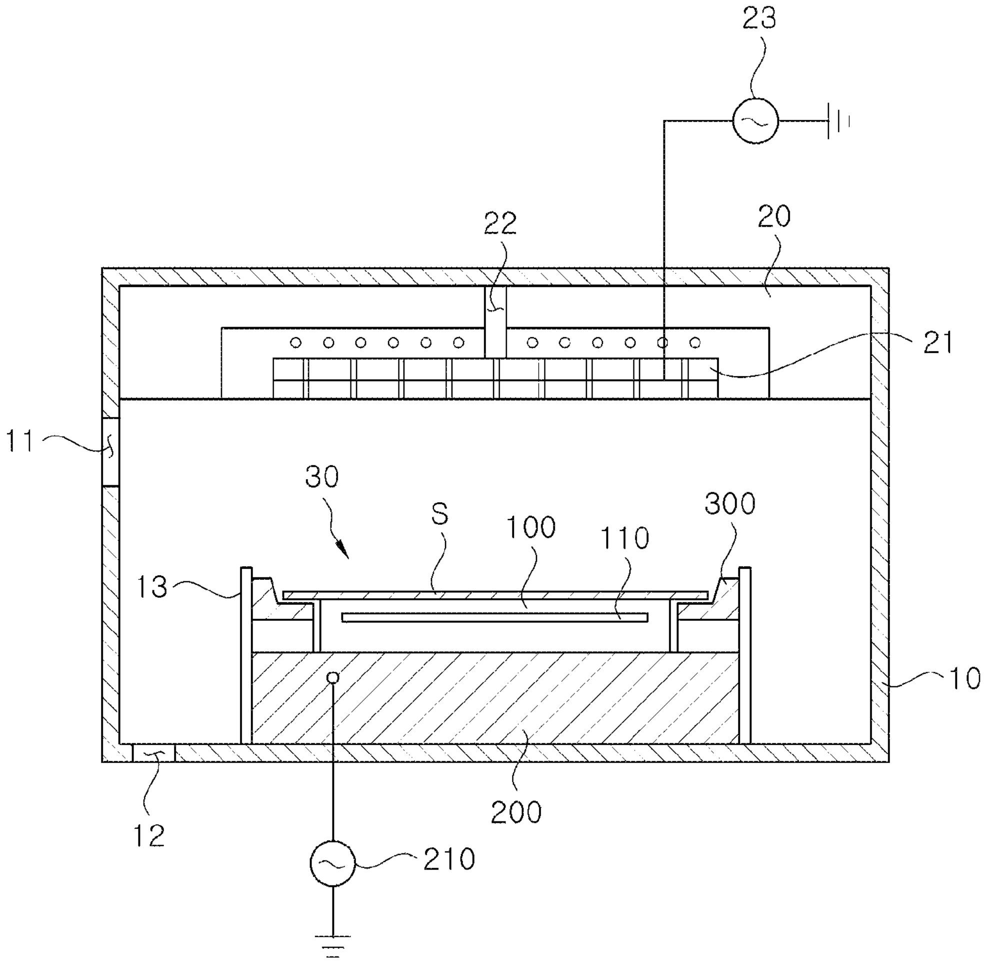
FIG. 1 is a schematic diagram of a substrate processing apparatus in which a focus ring unit according to an embodiment is used.

Hereinafter, embodiments will be described in detail so that those skilled in the art may easily practice the present disclosure with reference to the accompanying drawings. However, in describing a preferred embodiment in detail, if it is determined that a detailed description of a related known function or configuration may unnecessarily obscure the gist of the present disclosure, the detailed description will be omitted. In addition, the same reference numerals are used throughout the drawings for parts having similar functions and actions. In addition, in the present specification, terms such as 'on,' 'upper portion,' 'upper surface,' 'below,' 'lower portion,' ' lower surface,' ' side' and the like are based on the drawings, and may be changed depending on the direction in which components are actually disposed.

In addition, throughout the specification, when a portion is said to be 'connected' to another part, it is not only 'directly connected,' but also 'indirectly connected' with other components therebetween. Further, 'including' a certain component means that other components may be further included, rather than excluding other components unless otherwise stated.

As illustrated in FIG. 1, a substrate processing apparatus according to an embodiment includes a chamber 10, a plasma generating unit 20, and a substrate support assembly 30.

The chamber 10 provides a processing space for processing the substrate S therein. A film or pattern may be formed on the upper surface of the substrate S. The chamber 10 is provided to be hermetically sealed, and a passage 11 is formed in a side wall. The substrate S may be carried into the processing space within the chamber 10 through the passage 11, and the substrate S may be carried out from the processing space within the chamber 10 through the passage 11. The passage 11 is configured to be opened and closed by a separate driving device (not illustrated). The chamber 10 may be grounded, and an exhaust hole 12 is formed in a lower portion thereof. The exhaust hole 12 is connected to an exhaust line (not illustrated) and a pump (not illustrated). Reaction by-products generated during the treatment process and gas remaining in the inner space of the chamber 10 may be discharged to the outside through the exhaust hole 12. The inside of the chamber 10 is reduced to a predetermined pressure by the exhausting process.

A liner 13 may be provided inside the chamber 10. By the liner 13, the interior of the chamber 10 may be protected from by-products generated during the substrate processing process, gases remaining after the processing process, and the like. The liner 13 prevents impurities generated during processing from being deposited on the inner wall of the chamber 10 and/or on the substrate support assembly 30. The liner 13 may include an inner liner provided in a ring shape to surround the substrate support assembly 30 and an outer liner provided along an inner wall of the chamber 10.

The plasma generating unit 20 is located in the upper portion of the inside of the chamber 10. The plasma generating unit includes a shower head 21, a gas supply nozzle 22, and an upper power source 23.

The shower head 21 is spaced apart from the upper surface of the chamber 10 downwardly by a certain distance. The shower head 21 is located above the substrate support assembly 30. A certain space is formed between the shower head 21 and the upper surface of the chamber 10, and the shower head 21 may be provided in a plate shape having a certain thickness. The shower head 21 includes a plurality of spray holes, and the spray holes penetrate the upper and lower surfaces of the shower head 21 in a vertical direction.

The gas supply nozzle 22 supplies process gas into the chamber 10. The gas supply nozzle 22 is connected to the central portion of the upper surface of the chamber 10, receives gas from a gas storage unit (not illustrated) through a gas supply line (not illustrated), and supplies process gas into the chamber 10. An injection port is formed on the lower surface of the gas supply nozzle 22, and the flow rate of the process gas supplied to the chamber 10 may be adjusted using a separate valve (not illustrated) provided in the gas supply line (not illustrated).

The upper power source 23 is electrically connected to the plasma generating unit 20 to provide power to the plasma generating unit 20. The upper power source 23 may be provided as a high-frequency power source or a ground method. The plasma generating unit 20 may function as an upper electrode by receiving power from the upper power source 23.

The substrate support assembly 30 is disposed to face the plasma generating unit 20 inside the chamber 10. The substrate support assembly 30 supports the substrate S. The substrate support assembly 30 includes an electrostatic chuck 100 that adsorbs the substrate S using electrostatic force. The substrate supporting assembly 30 may support the substrate S in various manners such as mechanical clamping or the like. In the present disclosure, a case in which the substrate support assembly 30 supports the substrate S using the electrostatic chuck 100 will be described.

The substrate support assembly 30 includes an electrostatic chuck 100, abase 200, and a focus ring unit 300.

The substrate S may be mounted on an upper surface of the electrostatic chuck 100. The electrostatic chuck 100 is provided in a disc shape and may be provided as a dielectric substance. The upper surface of the electrostatic chuck 100 has a radius smaller than a radius of the substrate S. When the substrate S is disposed on the electrostatic chuck 100, the edge region of the substrate S is located outside the electrostatic chuck 100. The electrostatic chuck 100 applies an electrostatic force to the substrate S by receiving external power. The electrostatic chuck 100 is provided with an electrostatic electrode 110. The electrostatic electrode 110 is electrically connected to an adsorption power source (not illustrated) including a DC power source, and when current is applied to the electrostatic electrode 110 from the adsorption power source (not illustrated), an electrostatic force acts between the electrostatic electrode 110 and the substrate (S)). Accordingly, the substrate S is attracted to the upper surface of the electrostatic chuck 110.

The base 200 is provided below the electrostatic chuck 100. The upper surface of the base 200 is in contact with the lower surface of the electrostatic chuck 100, and the base 200 is also provided in a disk shape. The base 200 is provided as a conductive material. For example, the base 200 may be formed of aluminum. A cooling passage (not illustrated) may be provided inside the base 200 to cool the electrostatic chuck 100.

The base 200 may be electrically connected to a lower power source 210. The lower power source 210 may be provided as a high frequency power source that generates high frequency power, and the high frequency power source may be provided as an RF power source. The base 200 may function as a lower electrode by receiving high frequency power from the lower power supply 210. The base 200 may be provided grounded. When high-frequency power is applied to both the upper and lower electrodes in the chamber 10, or when the upper electrode is grounded and high-frequency power is applied to the lower electrode, an electrical field is generated between the upper and lower electrodes, and the process gas provided inside the chamber 10 is excited into a plasma state by the generated electrical field. The process gas excited into a plasma state may etch the substrate S.

The focus ring unit 300 is disposed to surround the outer circumference of the electrostatic chuck 100 at the edge of the substrate support assembly 30. The focus ring unit 300 serves to improve the uniformity of the plasma treatment of the substrate S.

Figure 2:
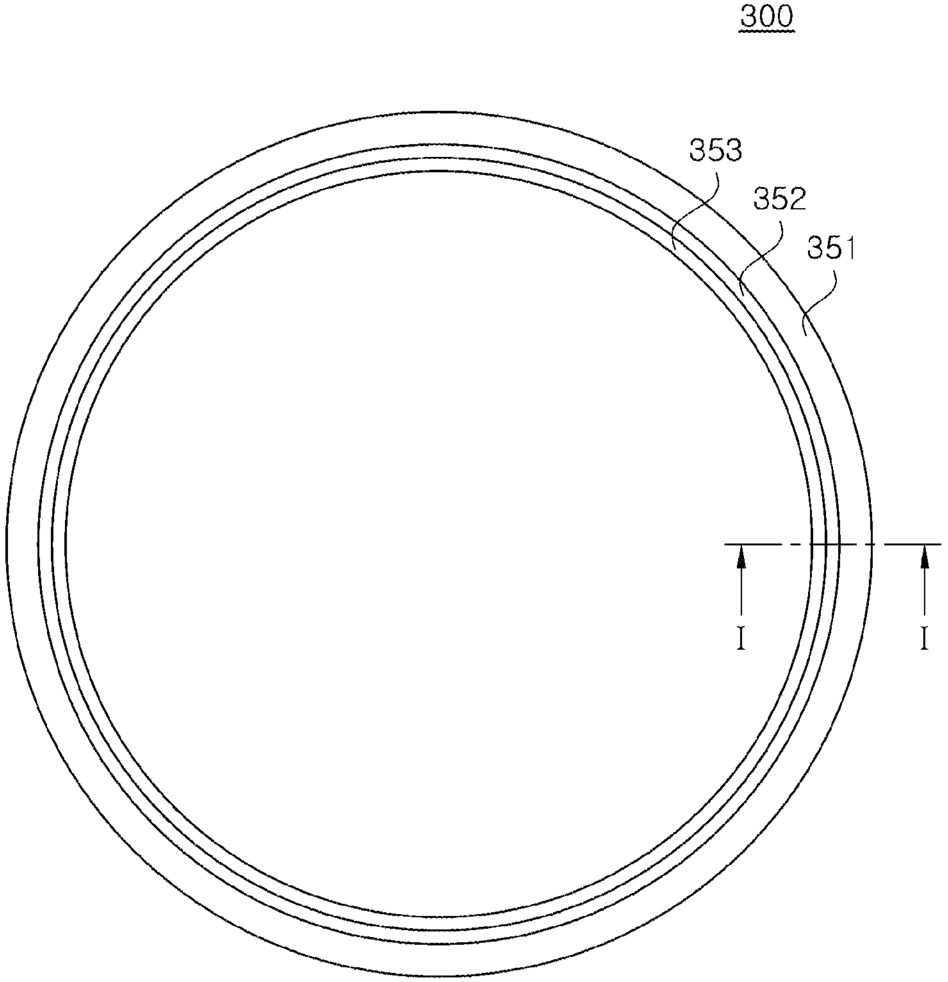
FIG. 2 is a plan view of a focus ring unit.
Figure 3:
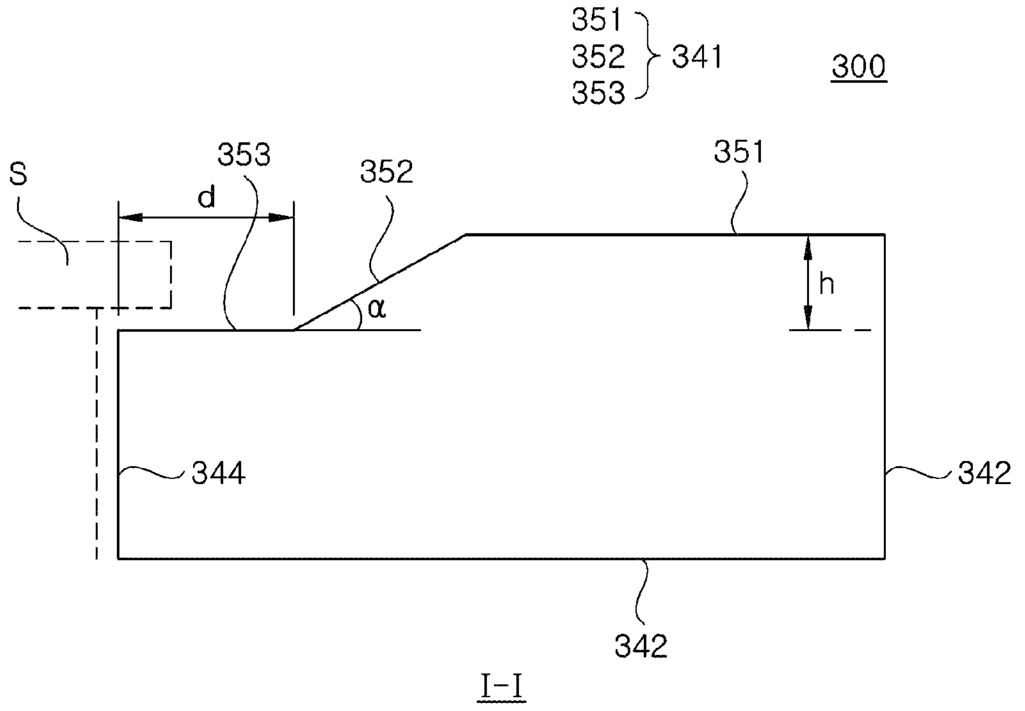
FIG. 3 is an I-I sectional view of the focus ring unit of FIG. 2.

A plan view of the focus ring unit 300 is illustrated in FIG. 2, and a sectional view II of FIG. 2 is illustrated in FIG. 3.

The focus ring unit 300 includes an upper surface 341, a radially inner surface 344, a radially outer surface 342, and a lower surface 343, and the upper surface 341 includes a first surface 351 and a second surface 353 parallel a radial direction of the substrate S, and an inclined surface 352 between the first surface 351 and the second surface 353. The second surface 353 has a predetermined length d, and this length d determines the distance between the substrate S and the inclined surface 352.

The inclined surface 352 is inclined at a predetermined angle α with respect to the radial direction while connecting the first surface 351 and the second surface 353, and a space between the first surface 351 and the second surface 353 has a height (h) by the inclined surface 352.

The angle (α), the distance (d), and the height (h) affect the plasma-sheath boundary formed during plasma processing, and depending on a change in the angle (α), the distance (d), and the height (h), the etching results at the edge portion of the substrate (S) may be different.

On the other hand, even if the shape of the focus ring unit 300 is determined, a hardware test is performed. The hardware test is to check the etching result of the etched substrate S after applying the designed focus ring unit 300 to the substrate processing apparatus of FIG. 1 and irradiating plasma thereon.

In the case of a hardware test, the test may be performed multiple times while changing a plurality of conditions. In this case, the hardware test is performed while changing the conditions affecting the plasma-sheath boundary, for example, the conditions for the exposed surface exposed to the plasma in the focus ring unit 300. Therefore, after manufacturing a plurality of focus ring units 300 for respective conditions, a plurality of tests are performed.

Figure 4:
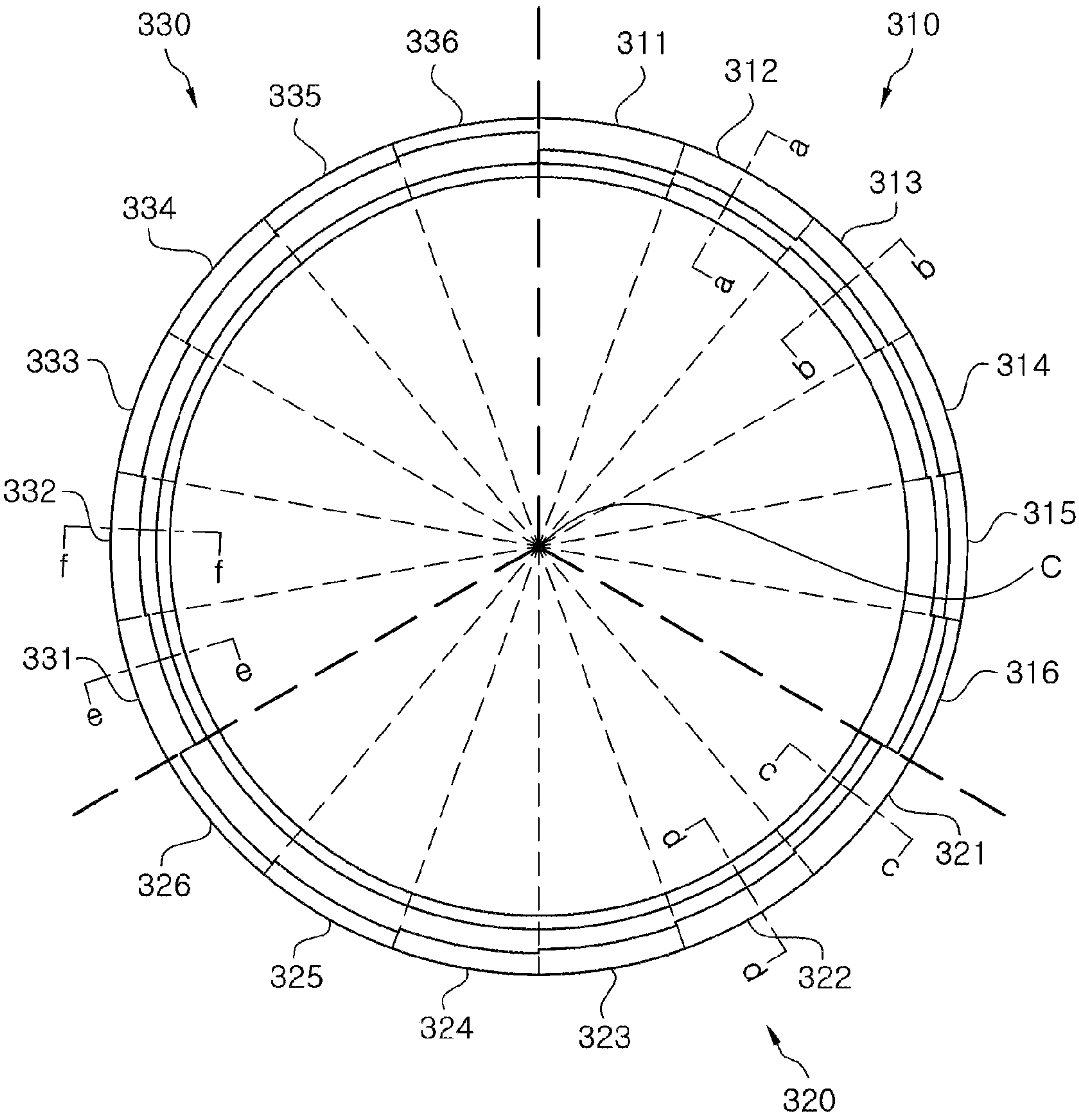
FIG. 4 is a plan view of a focus ring unit according to a first embodiment.
Figure 5:
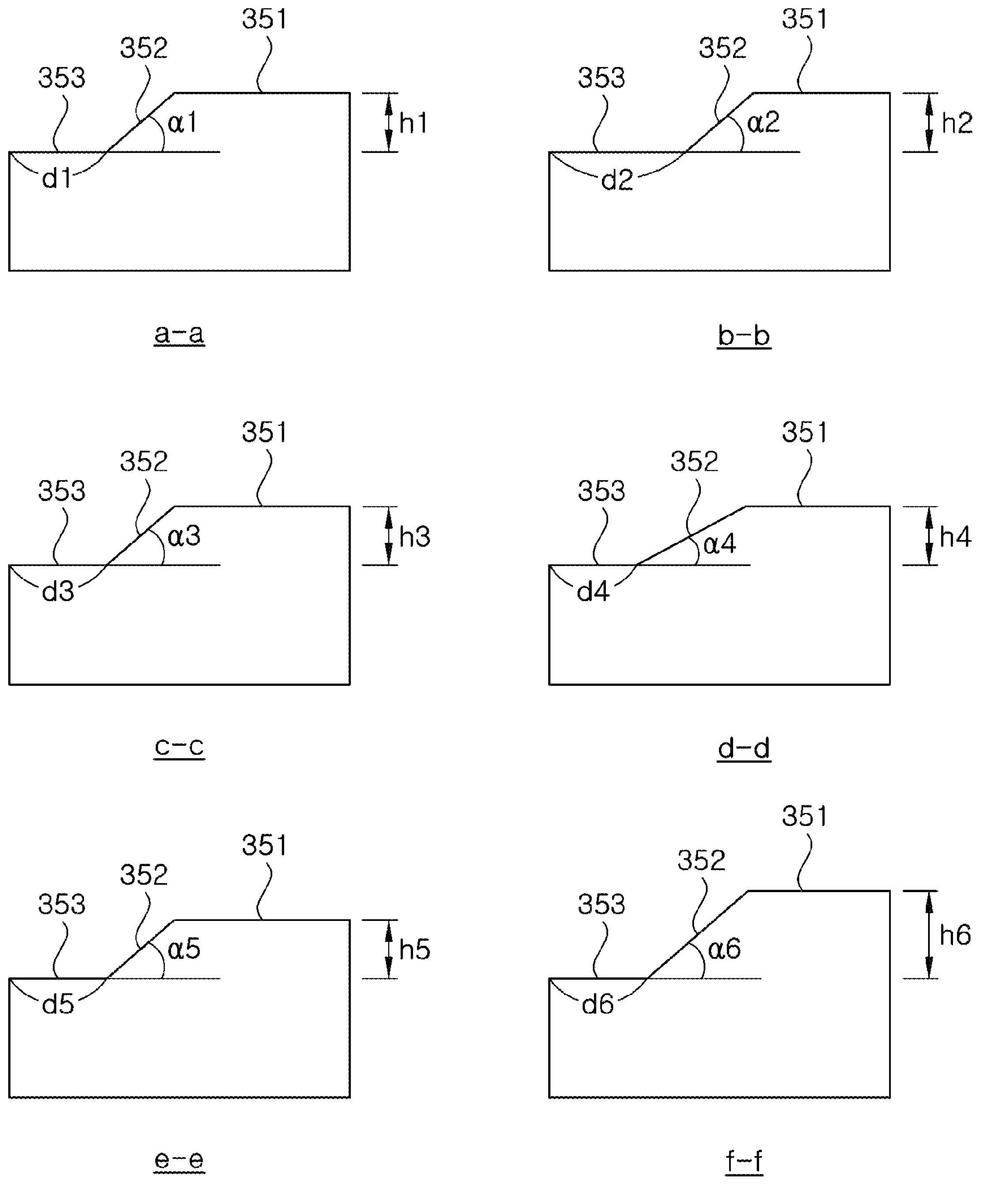
FIG. 5 is a cross-sectional view of each portion in the embodiment of FIG. 4.

The present disclosure may provide a focus ring unit 300 capable of finding optimal conditions without multiple tests, and the focus ring unit 300 according to an embodiment of the present disclosure is illustrated in FIGS. 4 and 5.

FIG. 4 is a plan view of the focus ring unit 300 according to a first embodiment, and FIG. 5 is a partial cross-sectional view of the focus ring unit 300 of FIG. 4, and illustrates cross-sectional views of respective portions taken along lines a-a to f-f in FIG. 4.

As illustrated in FIG. 4, the focus ring unit 300 according to the first embodiment includes a plurality of parts 311 to 316, 321 to 326, and 331 to 336 formed in a plurality of groups 310, 320, and 330. In this embodiment, the parts 311 to 316, 321 to 326, and 331 to 336 mean portions corresponding to predetermined angles from the center point of the focus ring unit 300, and in respective parts 311 to 316, 321 to 326, 331 to 336, at least one of the conditions of the exposed surface facing the plasma space is different.

In this embodiment, some parts 311 to 316 form a first group 310, some other parts 321 to 326 form a second group, and the remaining parts 331 to 336 form a third group 330, thereby forming a ring. The angles corresponding to the parts 311 to 316, 321 to 326, and 331 to 336 are all the same, and in this embodiment, respective parts 311 to 316, 321 to 326, and 331 to 336 are formed to have an angle of 20° based on the center point C when the focus ring unit 300 is viewed on a plane, but the present disclosure is not limited thereto. The angle may be changed. In addition, the angle does not have to be constant in all parts, and wide-angled parts and small-angled parts may be mixed if necessary.

The angle range is preferably 180° or less so that a plurality of parts may be provided, and may be 10° or more so that the substrate area that is not affected by the boundary conditions of respective parts 311 to 316, 321 to 326, and 331 to 336 may be evaluated, while the lower limit value may be a smaller value by the size of the substrate S and the like.

In this embodiment, the cross-sectional structure of the focus ring unit 300 is similar to the structure of FIGS. 2 and 3. For example, the focus ring unit 300 includes an upper surface 341, a radial inner surface 344, a radial outer surface 342, and a lower surface 343, and the upper surface 341 includes a first surface 351 and a second surface 353 parallel to the radial direction of the substrate S, and an inclined surface 352 between the first surface 351 and the second surface 353.

The inclined surface 352 connects the first surface 351 and the second surface 353 and is inclined at a predetermined angle α with respect to the radial direction, and the second surface 353 has a predetermined length d, and a space between the first surface 351 and the second surface 353 has a height h due to the inclined surface 352. In conjunction with the angle α and the length d, the height h also affects the plasma-sheath boundary.

In this embodiment, in respective parts (311 to 316, 321 to 326, and 331 to 336) in respective groups 310, 320 and 330, one of the above-mentioned length (d), angle (α), and height (h) is different.

In detail, referring to the cross sections a-a and b-b of FIG. 5, which are cross-sectional views of one part 312 and the other part 313 in the first group 310, it can be seen that the angles α and the heights h are the same ($\alpha 1=\alpha 2$, $h1=h2$), while the lengths (d) are different ($d1<d2$).

For example, respective parts 311 to 316 of the first group 310 have different lengths d, which are the starting positions of the inclined surfaces 352, which are the exposed surface, and the lengths d increase in the clockwise direction. The change in the value of length (d) is exaggerated in the drawings, but is fine to the extent of μm to mm in respective parts 311 to 316.

Respective parts 321 to 326 of the second group 320 have different angles α of the inclined surfaces 352 that are the exposed surfaces. Referring to the cross sections c-c and d-d of FIG. 5, which are cross-sectional views of one part 321 and the other part 322, it can be seen that the lengths (d) and the heights (h) are the same (d3=d4, h3=h4), but the angles (α) are different (α3>α4).

For example, the parts 321 to 326 of the second group 320 have the same starting position and height of the inclined surfaces 352, which are the exposed surfaces, but the angles α of the inclined surfaces 352 are different for respective parts 321 to 326, and the angles α decrease in the clockwise direction.

The parts 331 to 336 of the third group 330 have different heights h between the first surface 351 and the second surface 352. Referring to the cross sections e-e and f-f of FIG. 5, which are cross-sectional views of one part 331 and the other part 332, it can be seen that the lengths d and the angles α are the same (d5=d6, α5=α6), while the heights (h) between the first surfaces 351 and the second surfaces 352 are different (h5<h6).

The parts 331 to 336 of the third group 330 have the same starting position and angle of the inclined surfaces 353 as the exposed surfaces, but the lengths of the inclined surfaces 352 are different, so that the heights (h) between the first surfaces 351 and the second surfaces 352 are different, and the heights (h) increase in the clockwise direction. Although the change in the height (h) value is exaggeratedly illustrated in the drawings, it is about μm to mm in respective parts 331 to 336.

As illustrated in this embodiment, although it is one focus ring unit 300, the conditions of the exposed surfaces of the parts 311 to 316, 321 to 326, and 331 to 336 are different from each other, and in the shape of the focus ring unit 300 of this embodiment, at least ones of the start positions, the inclination angles, and the end positions of the inclined surfaces 352 are configured to be different from each other. Therefore, in the case of hardware testing with the focus ring unit 300 according to this embodiment, actual etching results for detailed individual values may be checked, and accordingly, since it is possible to identify and apply optimal values without multiple experiments, waste of human and material resources may be prevented.

Conditions that are changed in respective parts (311 to 316, 321 to 326, and 331 to 336) are conditions that affect the plasma-sheath boundary, for example, the condition of the exposed surface exposed toward the plasma, and like this embodiment, not all conditions of the exposed surfaces need to be changed, and of course, only one condition may be changed to form one focus ring unit 300, and only one condition need not be different for each of the parts 311 to 316, 321 to 326, and 331 to 336, and a plurality of conditions may be different. This will be described through another embodiment to be described later.

Figure 6:
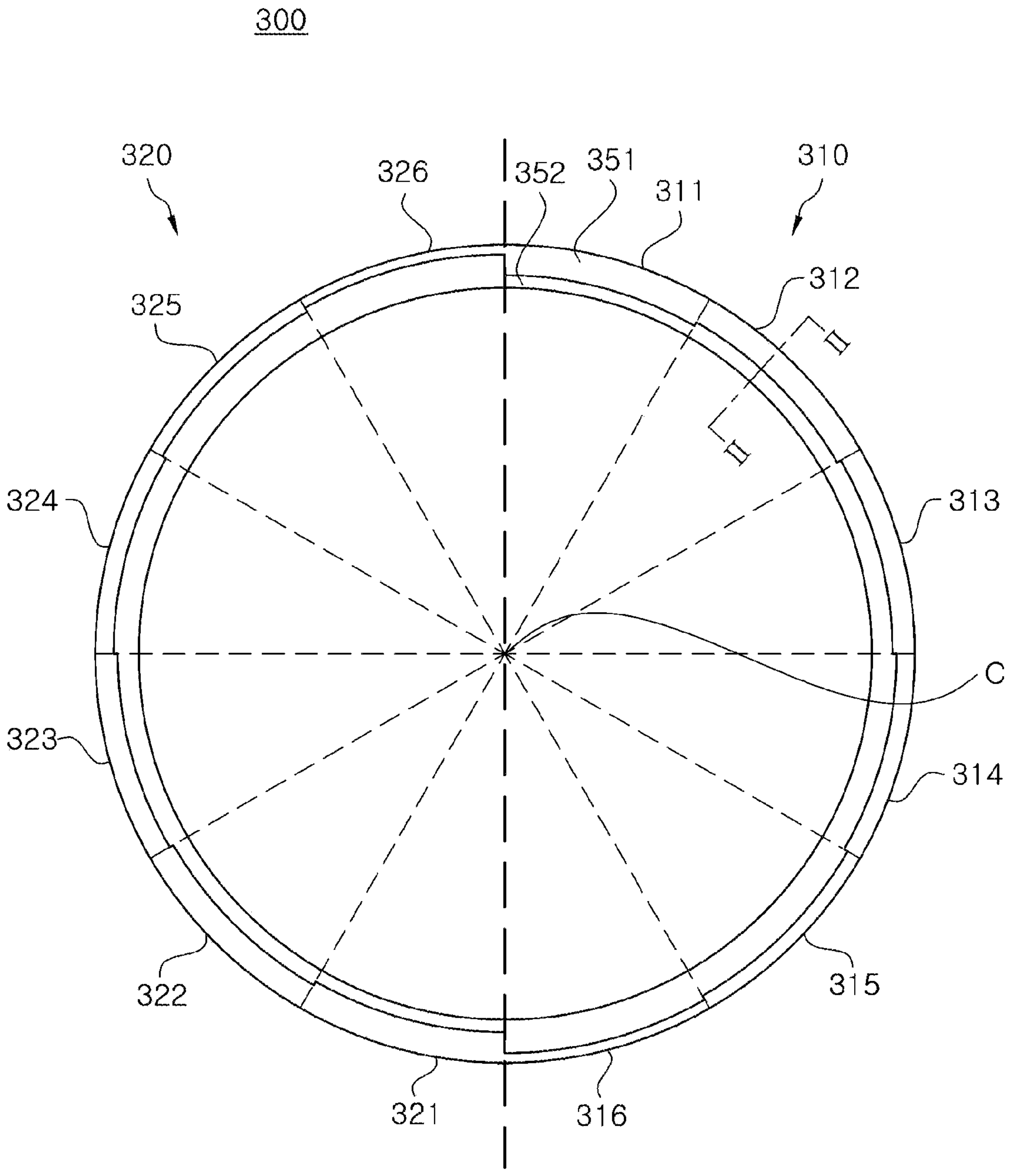
FIG. 6 is a plan view of a focus ring unit according to a second embodiment.
Figure 7:
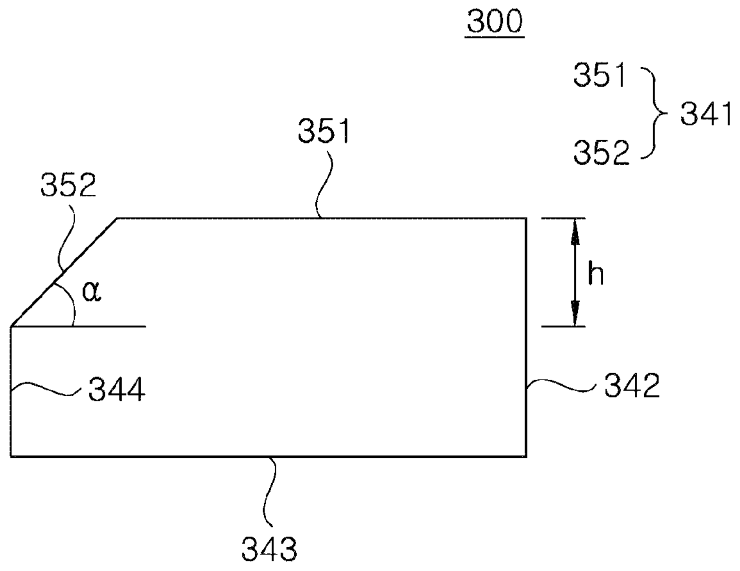
FIG. 7 is a II-II sectional view of the focus ring unit of FIG. 6.

FIG. 6 is a plan view of a focus ring unit 300 according to a second embodiment, and FIG. 7 is a II-II cross-sectional view of the focus ring unit 300 of FIG. 6.

In this embodiment, the focus ring unit 300 includes an upper surface 341, a lower surface 343, a radial inner surface 344 and a radial outer surface 342, and the upper surface 341 includes a first surface 351 parallel to the radial direction, and an inclined surface 352 connected to the radially inner end of the first surface 351 and extending at an angle α with respect to the radial direction. The focus ring unit 300 has a shape in which the distance from the electrostatic chuck 100 (see FIG. 1) to the substrate S (see FIG. 1) thereabove in the substrate processing apparatus is not changed, and has an exposed surface in which the inclined surface 352 and the first surface 351 are exposed toward the plasma.

The focus ring unit 300 according to this embodiment also includes a plurality of parts 311 to 316 and 321 to 326, and the plurality of parts 311 to 316 and 321 to 326 form a first group 310 and a second group 310.

In the case of the parts 311 to 316 of the first group 310, the angle α of the inclined surface 352 is different for respective parts 311 to 316, and in the case of the parts 321 to 326 of the second group 320, the height h between the first surface 351 and the radially inner starting position of the inclined surface 352 is different for respective parts 321 to 326.

In the case of the parts 311 to 316 of the first group 310, the angle α of the inclined surface 352 is different for respective parts 311 to 316 while the height h is constant, and therefore, when the angles α of the inclined surfaces decrease in the clockwise direction and the lengths of the inclined surfaces 352 increase stepwise in a clockwise direction. In the case of the parts 321 to 326 of the second group 320, the angles α of the inclined surfaces 352 are in a constant state, the height his different for respective parts 321 to 326, and the heights h increase in the clockwise direction, so that the lengths of the inclined surfaces 352 increase stepwise in the clockwise direction.

The present disclosure can be applied not only to the focus ring unit 300 of a specific shape, but may be applied to any designed focus ring unit 300, and as a plurality of parts 311 to 316 and 321 to 326 in which one or a plurality of exposed surface conditions are changed are included, there is an advantage in that hardware tests for a plurality of conditions may be simultaneously performed.

Figure 8:
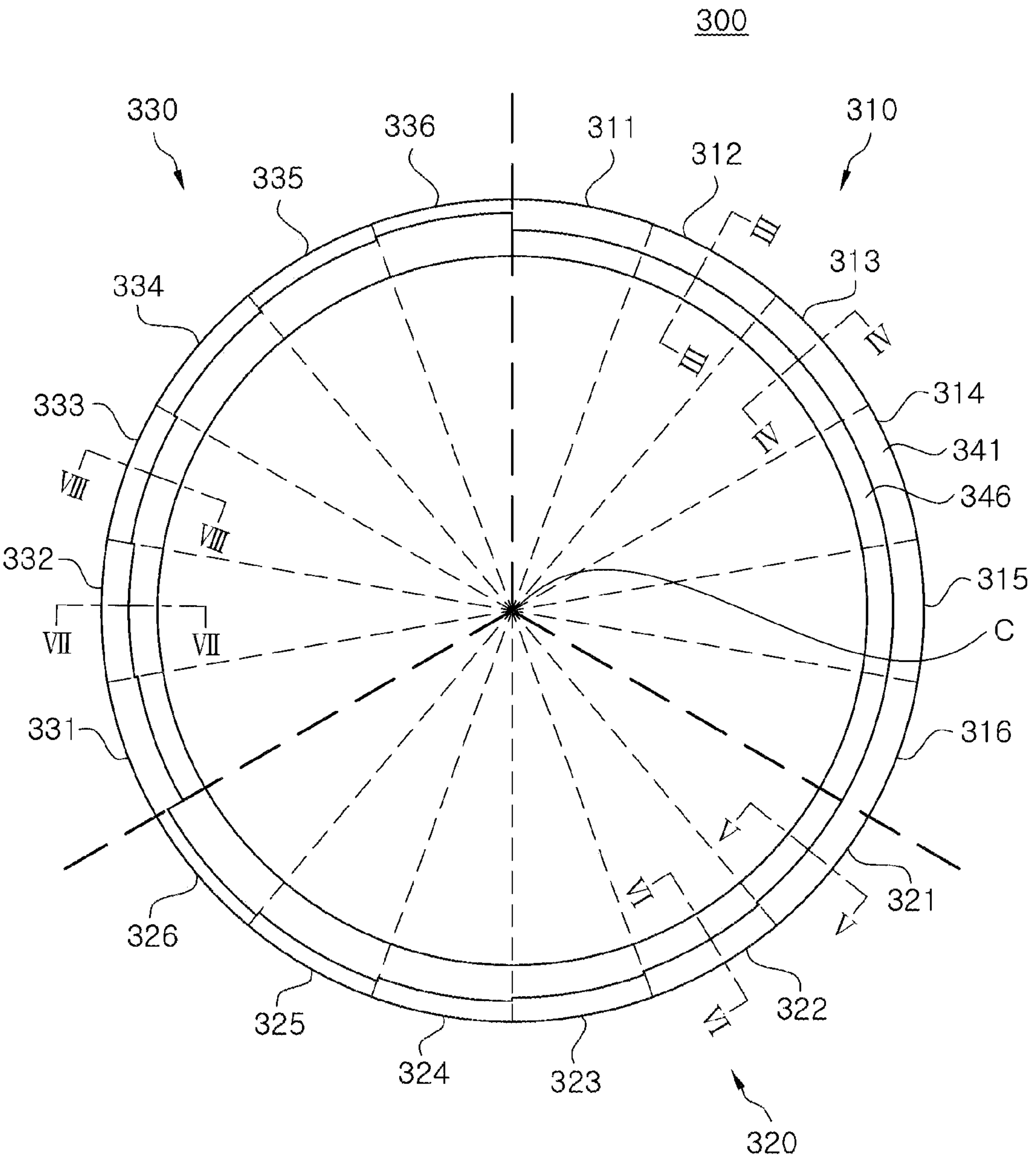
FIG. 8 is a plan view of a focus ring unit according to a third embodiment.
Figure 9:
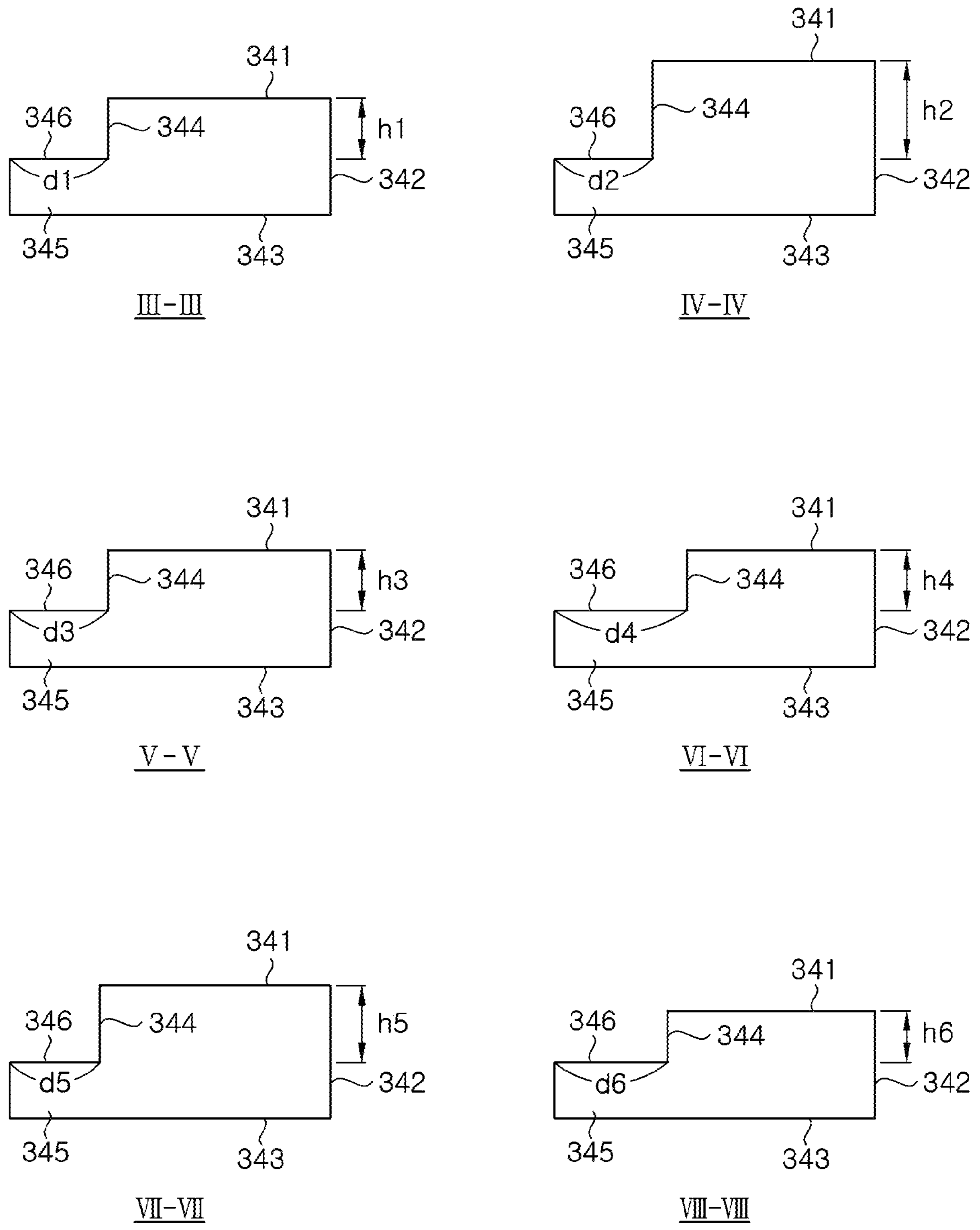
FIG. 9 is a cross-sectional view of each portion in the embodiment of FIG. 8.

FIGS. 8 and 9 illustrate a focus ring unit 300 according to a third embodiment. In detail, FIG. 8 is a plan view of the focus ring unit 300 according to the third embodiment, and FIG. 9 is a cross-sectional view of respective parts of the focus ring unit 300 of FIG. 8.

In this embodiment, the focus ring unit 300 includes an upper surface 341, a lower surface 343, a radially inner surface 344, a radially outer surface 342 and a protrusion 345. The upper surface 341 is parallel to the radial direction. The protrusion 345 protrudes radially inward from the inner surface 344 in the radial direction, and includes an upper surface 346 parallel to the radial direction. Similar to FIG. 3, the protrusion 345 may be located at least below the substrate S.

In this embodiment, the upper surface 341 becomes an exposed surface exposed toward the plasma, and the length d of the protrusion 345 that determines the starting position of the upper surface 341 and the height (h) from the protrusion 345 to the upper surface 341, determining the height of the upper surface 341, become the conditions of the exposed surface.

In this embodiment, the position of the upper surface 341 of the focus ring unit 300 is changed by the length d1 of the upper surface 346 of the protrusion, and the position of the upper surface 341 of the focus ring unit 300 is changed by the height h1 between the upper surface 346 of the protrusion and the upper surface 341, and these two conditions may be conditions for the exposed surface.

The focus ring unit 300 of this embodiment includes a plurality of parts 311 to 316, 321 to 326, and 331 to 336, and the plurality of parts 311 to 316, 321 to 326, and 331 to 336 form a first group 310, a second group 320, and a third group 330.

In respective parts 311 to 316 of the first group 310, heights from the upper surfaces 346 of the protrusions to the upper surfaces 341 are changed (h1<h2) in a state in which the lengths of the upper surfaces 346 of the protrusions are constant (d1=d2). For example, it is not illustrated that the height changes in the plan view of FIG. 8, but as illustrated in the cross sections III-III and IV-IV of FIG. 9, one part 312 and the other part 313 have different heights h, and the heights h increase in the clockwise direction (h1<h2).

As illustrated in cross sections V-V and VI-VI of FIG. 9, respective parts 321 to 326 in the second group 320 have a constant height (h3=h4) from the upper surface 346 of the protrusion to the upper surface 341, while the respective lengths of the upper surfaces 346 of the protrusions change (d3<d4). The lengths of the upper surfaces 346 of the protrusions increase in the clockwise direction.

In the third group 330, the parts 331 to 336 have different heights h5 and h6 from the upper surface 346 of the protrusion to the upper surface 341 and different lengths d5 and d6 of the upper surfaces 346 of the protrusions. For example, both the lengths of the upper surfaces 346 of the protrusions and the heights between the upper surfaces 341 of the protrusions and the upper surfaces 346, in the neighboring parts 331 to 336, change.

As illustrated in the cross sections VII-VII and VIII-VIII of FIG. 9, in the case of the height between the upper surface 346 of the protrusion and the upper surface 341, the height h5 of one part 332 is greater than the height h6 in the other part 333, and as for the lengths d5 and d6 of the upper surfaces 346 of the protrusions, the length d5 in one part 332 is shorter than the length d6 in the other part 333.

In the case of the third embodiment, in a plurality of exposed surface conditions by including, for example, parts 331 to 336 in which both the distance (d) and height (h) are changed together with parts 311 to 316 and 321 to 326 in which only one of the distance (d) and height (h) changes, the test in various conditions may be performed simultaneously and tests by a combination of changing conditions may also be performed, and therefore, it is advantageous to optimize specification.

Figure 10:
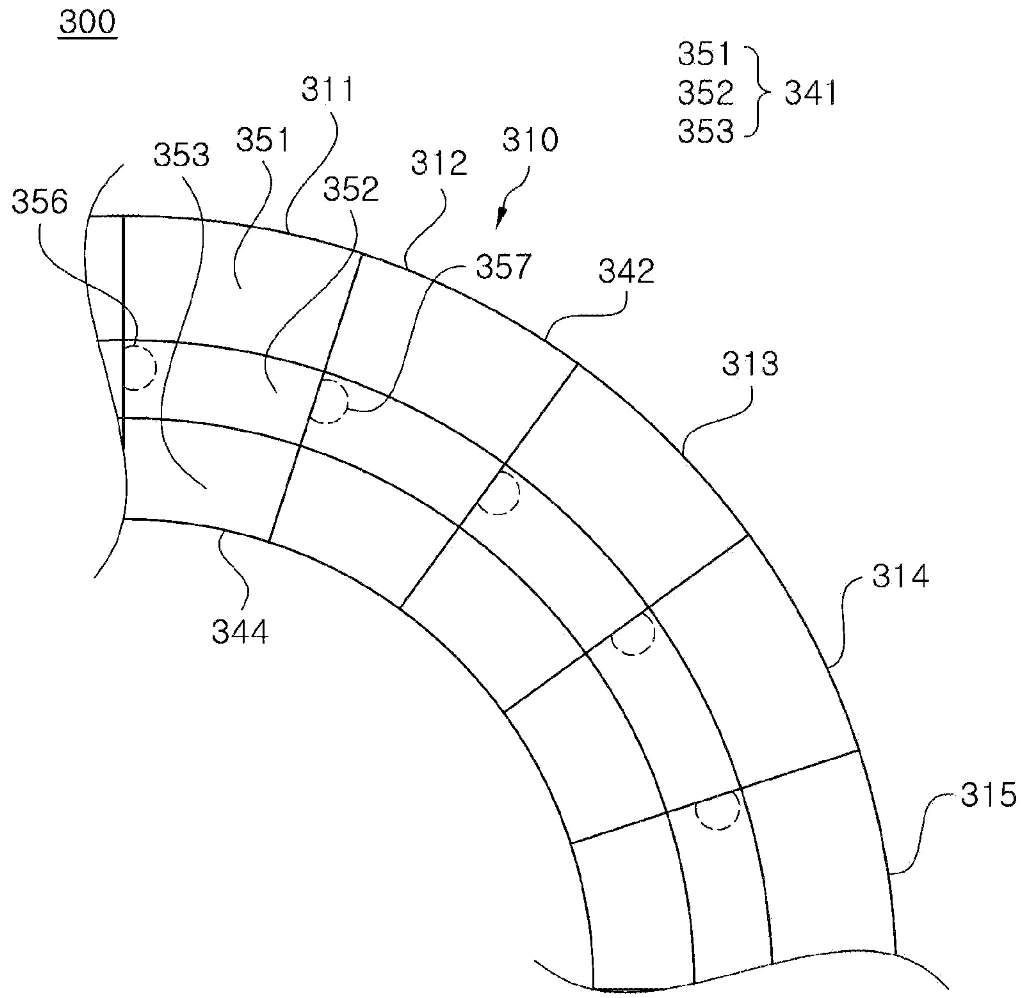
FIG. 10 is a partial plan view of a focus ring unit according to a fourth embodiment.
Figure 11:
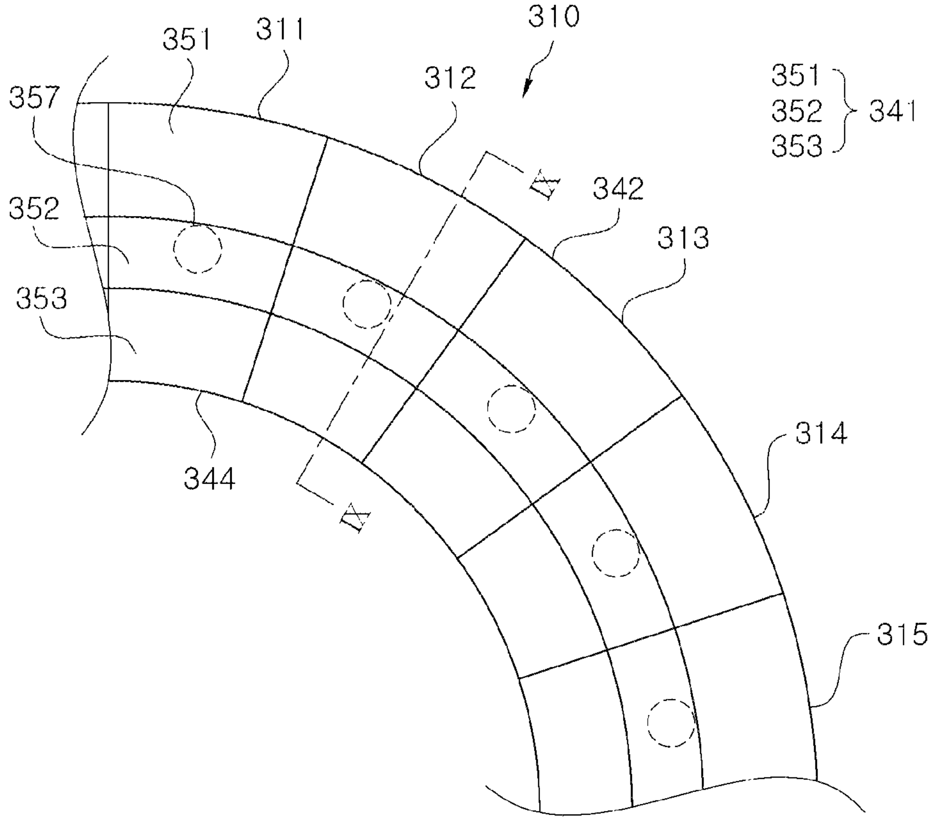
FIG. 11A is a partial plan view of a focus ring unit according to a fifth embodiment.
FIG. 11B is a cross-sectional view.
Figure 11:
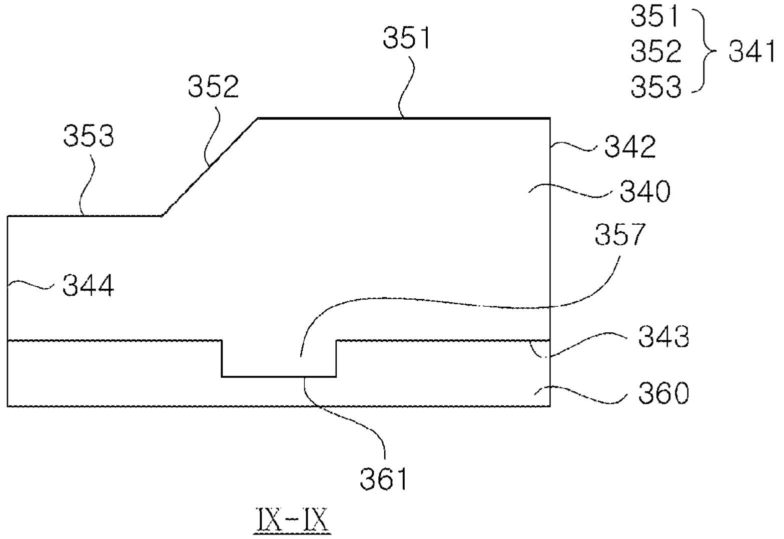

FIG. 10 is a partial plan view of a fourth embodiment, and FIGS. 11A and 11B are a plan view and a cross-sectional view of a fifth embodiment.

The focus ring unit 300 of FIG. 10 has a shape similar to the shape of the first embodiment. For example, the focus ring unit 300 includes an upper surface 341, a radial inner surface 344, a radial outer surface 342, and a lower surface, and the upper surface 341 includes a first surface 351 and a second surface 353 parallel to the radial direction of the substrate S, and an inclined surface 352 between the first surface 351 and the second surface 353.

Respective parts 311 to 315 are formed of separate components, and include a protrusion 357 on one side and a groove 356 in the other side, as a coupling portion for coupling the parts 311 to 315. The protrusion 357 of one part 311 is fitted into the groove 356 of the other neighboring part 312. In this manner, the focus ring unit 300 is formed by connecting neighboring parts 311 to 315 for all parts 311 to 315.

In the fourth embodiment, the focus ring unit 300 is configured by assembling the respective parts 311 to 315, and the parts 311 to 315 may be respectively produced and assembled. Therefore, by forming the focus ring unit 300 by configuring the parts 311 to 315 according to the conditions to be tested, finding a ring specification that satisfies the required condition may be facilitated.

In the fifth embodiment of FIGS. 11A and 11B, the focus ring unit 300 includes an upper ring 340 and a lower ring 360, and the upper ring 340 has an upper surface 341, a radial inner surface 344, a radial outer surface 342, a lower surface 343, and a protrusion 357 formed on the lower surface. The lower ring 360 includes a coupling groove 361 in contact with the lower surface of the upper ring and corresponding to the protrusion 357. The protrusion 357 and the coupling groove 361 constitute a coupling portion that couples the upper ring 340 and the lower ring 360.

The upper ring 340 is formed by assembling the parts 311 to 315. Unlike the fourth embodiment in which the parts 311 to 315 are coupled to each other, the parts 311 to 315 have a ring shape as the protrusions 357 of respective parts 311 to 315 are inserted into the coupling grooves 361 of the lower ring 360, respectively.

In the case of the fifth embodiment, the individual parts 311 to 315 may also be respectively produced and assembled as in the fourth embodiment, and in the case of the fifth embodiment, it is advantageous in that a basic shape may be provided by the lower ring 360 even if a portion of the parts 311 to 315 is missing.

On the other hand, as long as the parts 311 to 315 of the focus ring unit 300 may be assembled and configured, the present disclosure is not limited to the fourth or fifth embodiment, and various assembly forms may be applied.

Figure 12:
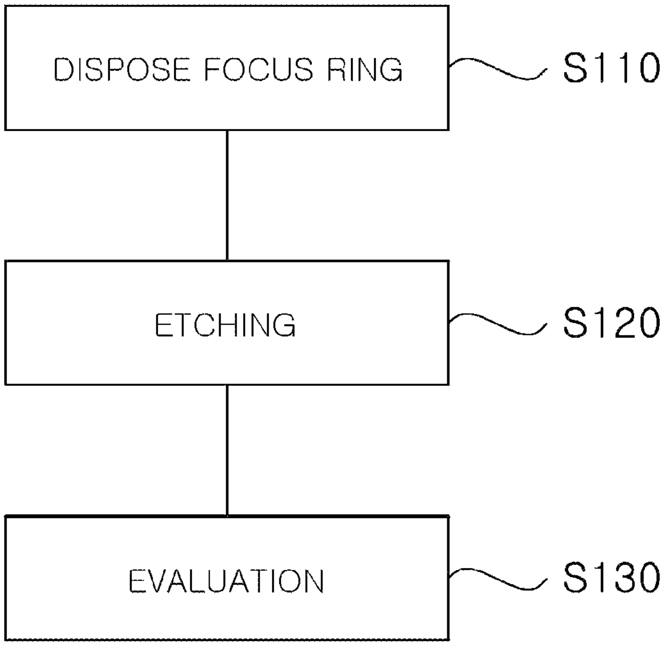
FIG. 12 is a flowchart of a test method using a focus ring unit according to an embodiment.
Figure 13:
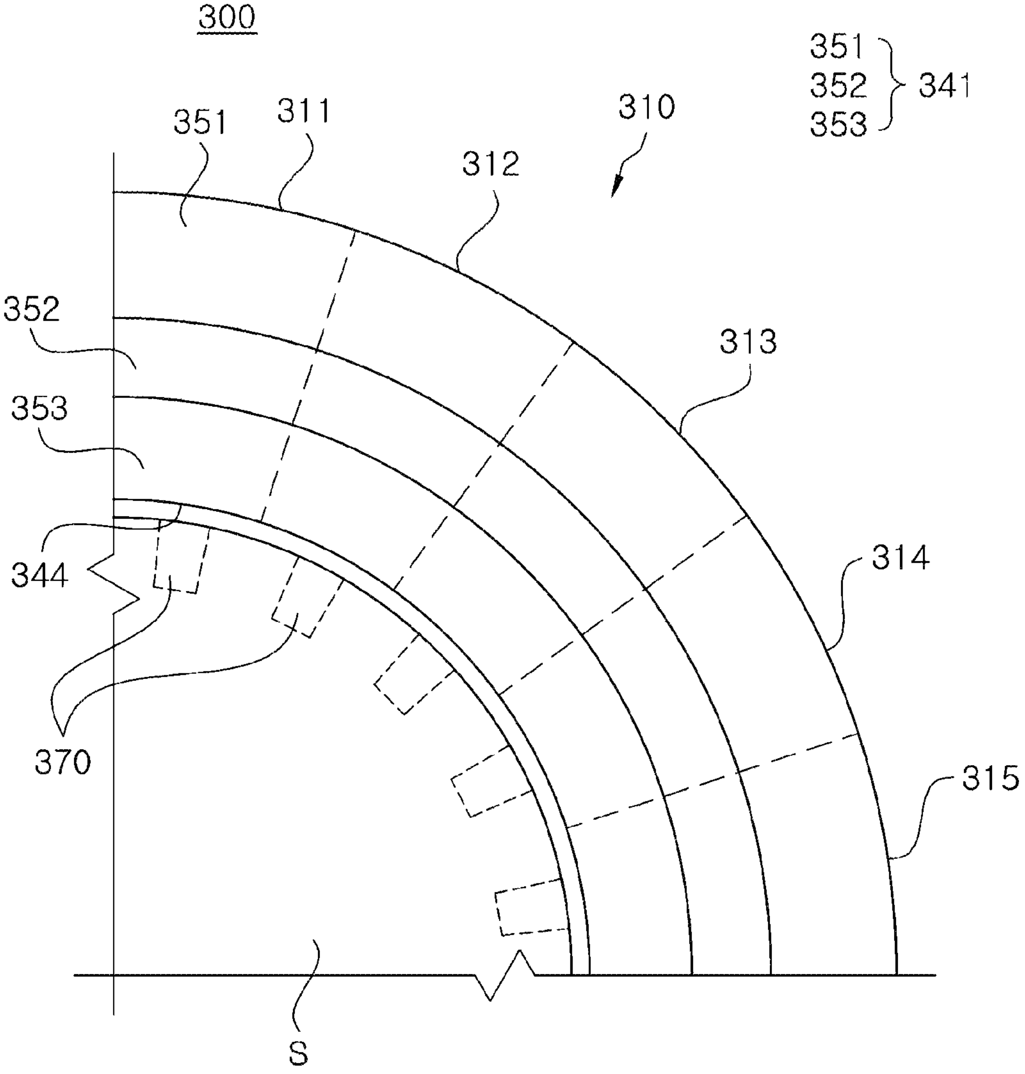
FIG. 13 is a schematic diagram illustrating an inspection area of a substrate in an evaluation operation of FIG. 12.

FIG. 12 illustrates a method of performing a hardware test using the focus ring unit 300 according to an embodiment, and FIG. 13 illustrates an inspection area during a hardware test.

Referring to FIGS. 1 and 12, the method of performing a test using the focus ring unit 300 of the present disclosure includes a positioning operation (S110) of seating the focus ring unit 300 in a substrate processing apparatus as illustrated in FIG. 1; an etching operation (S120) of seating the substrate S on the electrostatic chuck 100 of the substrate processing apparatus in a state in which the focus ring unit 300 is disposed, and then operating the plasma generating unit 20 to etch the substrate S; and an evaluation operation (S130) of evaluating the edge region of the etched substrate S.

As illustrated in FIG. 13, since the focus ring unit 300 according to an embodiment of the present disclosure is configured by connecting or assembling a plurality of parts 311 to 315, the condition of the exposed surface of the focus ring unit 300 may change discontinuously at the interface between the parts 311 to 315. Therefore, the inspection area 370 includes middle portions of respective parts 311 to 315 in the circumferential direction of the substrate S, and the inspection areas 370 are set to correspond to parts 311 to 315, respectively, and the etching result of the edge portion of the substrate S by the respective parts 311-315 is reviewed.

When the focus ring unit 300 according to an embodiment of the present disclosure is used in this manner, a result of a plurality of focus ring unit 300 values may be obtained by etching one substrate S, and thus, it is advantageous in optimizing the ring specification.

The present disclosure may provide the focus ring unit 300, used for hardware testing for designing a focus ring, or may be used for actual plasma processing rather than testing depending on circumstances.

As set forth above, according to an embodiment, a focus ring unit that is advantageous in determining the specifications of a focus ring and securing process conditions thereof by testing a plurality of focus ring shapes at once may be provided.

While example embodiments have been illustrated and described above, it will be apparent to those skilled in the art that modifications and variations could be made without departing from the scope of the present disclosure as defined by the appended claims.

What is claimed is:

1. A focus ring unit, as a focus ring used in a substrate processing device, comprising:

a plurality of parts with different conditions of an exposed surface facing a plasma space in a circumferential direction, wherein the exposed surface of each of the plurality of parts includes:

an inclined surface having an inclination angle with respect to a radial direction of the focus ring, and a first surface connected to an outer end of the inclined surface in the radial direction and parallel to the radial direction, and wherein a condition of the exposed surface includes at least the inclination angle of the inclined surface and a height by the inclined surface, wherein the plurality of parts comprises a first group and a second group, wherein the inclination angle of the inclined surface of each part of the first group differs while the height by the inclined surface of each part of the first group remains constant, wherein the height by the inclined surface of each part of the second group differs while the inclination angle of the inclined surface of each part of the second group remains constant, wherein each part of the plurality of parts is configured to correspond to an inspection area located at an edge region of a substrate, the inspection area including a middle portion of the exposed surface of the corresponding part in the circumferential direction, and wherein each part of plurality of parts defines a localized plasma-facing region of the focus ring unit that is configured to interact with a distinct edge portion of the substrate.

2. The focus ring unit of claim 1, wherein the exposed surface of each of the plurality of parts further includes a second surface connected to an inner end of the inclined surface in the radial direction and parallel to the radial direction.

3. The focus ring unit of claim 2, wherein the condition of the exposed surface further includes a length of the second surface in the radial direction or a distance from a center of the focus ring to a starting position of the inclined surface.

4. The focus ring unit of claim 3, wherein the plurality of parts further comprises a third group, wherein the length of the second surface in the radial direction of each part of the third group differs while both the inclination angle of the inclined surface of each part of the third group and the height by the inclined surface of each part of the third group remains constant.

5. The focus ring unit of claim 4, wherein the length of the second surface in the radial direction of each part of the first group and the length of the second surface in the radial direction of each part of the second group remain constant.

6. The focus ring unit of claim 1, wherein the inclination angle of the inclined surface of each part of the first group decreases in a clockwise direction.

7. The focus ring unit of claim 1, wherein the height by the inclined surface of each part of the second group increases in a clockwise direction.

8. The focus ring unit of claim 1, wherein each part of the plurality of parts includes a protrusion on a first side and a groove on a second side, wherein the protrusion of each part is configured to connect to the groove of a neighboring part.

9. The focus ring unit of claim 1, wherein in the plurality of parts, the condition of the exposed surface is changed at the same first angle from a center of a ring.

10. The focus ring unit of claim 9, wherein the first angle is 10° or more and 180° or less.

11. The focus ring unit of claim 1, wherein an inner diameter and an outer diameter of the focus ring are constant.

12. The focus ring unit of claim 11, wherein exposed surfaces of the plurality of parts are divided by a boundary surface, and the plurality of parts are assembled.

13. The focus ring unit of claim 11, wherein each of the plurality of parts includes a coupling portion coupled to a neighboring part.

14. The focus ring unit of claim 11, further comprising a lower ring connected to the plurality of parts, wherein the plurality of parts include a coupling portion coupled to the lower ring.

15. A focus ring unit used in a substrate processing apparatus, comprising:

a plurality of parts including:

a first upper surface, a protrusion protruding inward in a radial direction, the protrusion including a second upper surface parallel to the radial direction, wherein the plurality of parts are configured to have a first angle from a center of the focus ring unit and connected to form the focus ring unit, the plurality of parts include a condition of an exposed surface facing a plasma space, the condition of the exposed surface includes at least a height between the first upper surface and the second upper surface and a length of the second upper surface wherein the plurality of parts comprises a first group and a second group, wherein the height between the first upper surface and the second upper surface of each part of the first group differs while the length of the second upper surface of each part of the first group remains constant, wherein the length of the second upper surface of each part of the second group differs while the height between the first upper surface and the second upper surface of each part of the second group remains constant, wherein each part of the plurality of parts is configured to correspond to an inspection area located at an edge region of a substrate, the inspection area including a middle portion of the exposed surface of the corresponding part in a circumferential direction, and wherein each part of the plurality of parts defines a localized plasma-facing region of the focus ring unit that is configured to interact with a distinct edge portion of the substrate.

16. The focus ring unit of claim 15, wherein the first angle is 10° or more and 180° or less.

17. The focus ring unit of claim 15, wherein a minimum distance from the center of the focus ring unit to the second surface in the part is constant.

18. The focus ring unit of claim 15, wherein the plurality of parts further comprises a third group, wherein the height between the first upper surface and the second upper surface of each part of the third group differs and the length of the second upper surface of each part of the third group differs.

19. The focus ring unit of claim 15, wherein each part of the plurality of parts includes a protrusion on a first side and a groove on a second side, wherein the protrusion of each part is configured to connect to the groove of a neighboring part.

20. A substrate processing device comprising:

a chamber providing a processing space therein;

an electrostatic chuck disposed within the chamber and supporting a substrate;

a focus ring unit disposed to surround an outer circumference of the electrostatic chuck; and a plasma generating unit generating plasma in the chamber, wherein the focus ring unit is the focus ring unit according to claim 1.

* * * * *